US010003119B2

(12) United States Patent
Lee

(10) Patent No.: US 10,003,119 B2
(45) Date of Patent: Jun. 19, 2018

(54) BASE STATION INTERFACE DEVICE OF DISTRIBUTED ANTENNA SYSTEM

(71) Applicant: SOLiD, INC., Seongnam-si, Gyeonggi-do (KR)

(72) Inventor: Dongwon Lee, Seongnam-si (KR)

(73) Assignee: SOLiD, INC., Seongnam-si (KR)

( * ) Notice: Subject to any disclaimer, the term of this patent is extended or adjusted under 35 U.S.C. 154(b) by 0 days. days.

(21) Appl. No.: 15/421,751

(22) Filed: Feb. 1, 2017

(65) Prior Publication Data
US 2017/0373417 A1 Dec. 28, 2017

(30) Foreign Application Priority Data
Jun. 23, 2016 (KR) ........................ 10-2016-0078703

(51) Int. Cl.
| | | |
|---|---|---|
| H01R 31/00 | (2006.01) | |
| H01Q 1/22 | (2006.01) | |
| H01R 31/06 | (2006.01) | |
| H01R 13/66 | (2006.01) | |
| H01R 24/54 | (2011.01) | |
| H05K 7/14 | (2006.01) | |

(Continued)

(52) U.S. Cl.
CPC ........... *H01Q 1/22* (2013.01); *H01R 13/6683* (2013.01); *H01R 24/54* (2013.01); *H01R 31/06* (2013.01); *H05K 7/1452* (2013.01); *H05K 7/20563* (2013.01); *H01R 9/05* (2013.01); *H01R 9/0515* (2013.01); *H01R 13/6315* (2013.01); *H01R 13/659* (2013.01); *H01R 24/38* (2013.01); *H01R 24/50* (2013.01); *H01R 33/88* (2013.01); *H01R 33/94* (2013.01)

(58) Field of Classification Search
CPC ........ H01R 24/54; H01R 31/06; H01R 33/88; H01R 33/94; H01R 13/659; H01R 24/38; H01R 9/05; H01R 24/50; H01R 9/0515

USPC .............................. 439/638, 541.5, 578, 581
See application file for complete search history.

(56) References Cited

U.S. PATENT DOCUMENTS 4,846,731 A * 7/1989 Alwine ................ H01R 24/542
439/642
6,254,408 B1 7/2001 Hattori et al.
(Continued)

FOREIGN PATENT DOCUMENTS

| CN | 102195712 A | 9/2011 |
|---|---|---|
| JP | 2000-36357 A | 2/2000 |
| KR | 10-2011-0115514 A | 10/2011 |

OTHER PUBLICATIONS

Notice to Submit Response received in the Korean Patent Office in Application No. KR 10-2016-0078703 dated Apr. 19, 2017, along with English translation thereof.

*Primary Examiner* — Abdullah Riyami
*Assistant Examiner* — Justin Kratt
(74) *Attorney, Agent, or Firm* — Sughrue Mion, PLLC

(57) ABSTRACT

Disclosed is a base station device including a an interface board, which is located in a housing and has a first surface and a second surface opposite to the first surface, comprising a relay connector of which one end is exposed on the first surface and an opposite end is exposed on the second surface; a base station signal matching unit mounted on the first surface and comprising a first connector coupled to the one end of the relay connector; and a base station signal processing unit mounted on the second surface and comprising a second connector coupled to the opposite end of the relay connector.

16 Claims, 9 Drawing Sheets

(51) Int. Cl.
  *H05K 7/20*     (2006.01)
  *H01R 33/94*    (2006.01)
  *H01R 9/05*     (2006.01)
  *H01R 33/88*    (2006.01)
  *H01R 13/659*   (2011.01)
  *H01R 24/38*    (2011.01)
  *H01R 24/50*    (2011.01)
  *H01R 13/631*   (2006.01)

(56) References Cited

U.S. PATENT DOCUMENTS 8,206,159 B2    6/2012   Naito et al.
8,323,058 B2 *  12/2012  Flaherty ............. H01R 13/6277
                                              439/680
8,593,828 B2 *  11/2013  Blackwell, Jr. ......... H05K 1/11
                                              361/720

* cited by examiner

BASE STATION INTERFACE DEVICE OF DISTRIBUTED ANTENNA SYSTEM

CROSS REFERENCE TO RELATED APPLICATION

This application claims priority from Korean Patent Application No. 10-2016-0078703, filed on Jun. 23, 2016, in the Korean Intellectual Property Office, the contents of which is incorporated herein by reference in its entirety.

BACKGROUND

1. Field

One or more embodiments relate to a base station interface device of a distributed antenna system 2. Description of the Related Art A distributed antenna system (DAS), which is an example of a relay system relaying a communication between a base station and a user terminal, has been used to extend service coverage of the base station so as to provide a mobile communication service even to a shadow area which inevitably appears either indoor or outdoor environments.

The DAS, after receiving a base station signal from a base station and amplifying the base station signal based on a downlink path, transmits the amplified base station signal to a user terminal in a service area, and amplifies a terminal signal received from the user terminal in the service area based on an uplink path and transmits the amplified terminal signal to the base station. Matching and processing of signals transmitted and received between the base station and the DAS, for example, power control, low-noise amplification, or filtering of signals are essential to realize such a relay function of the DAS. Therefore, a base station interface device including a base station signal matching unit and a base station signal processing unit is used for the DAS.

According to an existing base station interface device, it is difficult to efficiently use a space and miniaturize the device because a base station signal matching unit and a base station signal processing unit are arranged in layers, and furthermore, it is difficult for a manager to install and manage the device, and to protect a connection between the units because the units are connected to each other by cables.

SUMMARY

One or more embodiments include a base station interface device of a distributed antenna system (DAS) capable of efficiently arranging a base station signal matching unit and a base station signal processing unit, easily connecting the units, and stably protecting the connection from outside.

Additional aspects will be set forth in part in the description which follows and, in part, will be apparent from the description, or may be learned by practice of the presented embodiments.

According to an aspect of the inventive concept, there is provided a base station interface device including: an interface board, which is located in a housing and determines an upper portion of a first surface as a first mounting location and an upper portion of a second surface opposite to the first surface as a second mounting location, comprising a relay connector wherein one end is exposed to the upper portion of the first surface and the other end is exposed to the upper portion of the second surface; a base station signal matching unit mounted on the first mounting location and comprising a first connector coupled to the one end of the relay connector; and a base station signal processing unit mounted on the second mounting location and comprising a second connector coupled to the other end of the relay connector, wherein at least one of the first and second connector comprises a tapered portion, wherein a diameter of the tapered portion becomes larger toward the end.

According to an exemplary embodiment, the relay connector may include: a relay connector contact wherein one end contacts a first connector contact of the first connector and the other end contacts a second connector contact of the second connector; a relay connector body configured to surround the relay connector contact; and a relay connector insulating member located between the relay connector contact and at least a part of the relay connector body.

According to an exemplary embodiment, the first connector may include the tapered portion, wherein a diameter of the tapered portion becomes larger toward the relay connector, and the relay connector body may include a complementary tapered portion, wherein a diameter of the complementary tapered portion becomes smaller toward the first connector.

According to an exemplary embodiment, the second connector may include the tapered portion, wherein a diameter of the tapered portion becomes larger toward the relay connector, and the relay connector body may include an elastic member which is disposed on a tip toward the second connector and capable of being elastically deformed in a direction crossing a coupling direction of the second connector and the relay connector when the second connector is coupled to the relay connector.

According to an exemplary embodiment, the relay connector may penetrate through a main body of the interface board, wherein the one end is exposed to the upper portion of the first surface and the other end is exposed to the upper portion of the second surface.

According to an exemplary embodiment, at least a part of the relay connector may be inserted in and coupled to the first connector.

According to an exemplary embodiment, at least a part of the relay connector may be inserted in and coupled to the second connector.

According to an exemplary embodiment, the first connector may include: a first connector contact configured to contact a relay connector contact of the relay connector; a relay connector body configured to surround the first connector contact; and a first connector insulating member located between the first connector contact and at least a part of the first connector body.

According to an exemplary embodiment, the first connector body may include: a first cap comprising the tapered portion, wherein a diameter of the tapered portion becomes larger toward the relay connector; and a first support unit configured to support the first cap.

According to an exemplary embodiment, the second connector may include: a second connector contact configured to contact a relay connector contact of the relay connector; a second connector body configured to surround the second connector contact and form the tapered portion, wherein a diameter of the tapered portion becomes larger toward the relay connector; and a second connector insulating member located between the second connector contact and at least a part of the second connector body.

According to an exemplary embodiment, the interface board may include a first sensing connector, wherein one end is exposed to the upper portion of the first surface, and the base station signal matching unit may include a second sensing connector coupled to the first sensing connector.

According to an exemplary embodiment, at least a part of the first sensing connector may be inserted in and coupled to the second sensing connector.

According to an exemplary embodiment, the second sensing connector may include a sensing connector tapered portion, wherein a diameter of the sensing connector tapered portion becomes larger toward the first sensing connector.

According to an exemplary embodiment, the second sensing connector may include: a second sensing connector contact configured to contact a first sensing connector contact of the first sensing connector; and a second sensing connector body configured to surround the second sensing connector contact, wherein the second sensing connector contact and at least a part of the second sensing connector body directly contact to each other.

According to an exemplary embodiment, the base station interface device may further include a control unit configured to sense an electrical connection between the interface board and the base station signal matching unit by coupling the first sensing connector to the second sensing connector.

According to an exemplary embodiment, the base station interface device may further include a fan unit, which is disposed adjacent to the base station signal matching unit, configured to remove heat from the base station signal matching unit, and the control unit may drive the fan unit when the electrical connection between the interface board and the base station signal matching unit is sensed.

BRIEF DESCRIPTION OF THE FIGURES

These and/or other aspects will become apparent and more readily appreciated from the following description of the embodiments, taken in conjunction with the accompanying drawings in which.

DETAILED DESCRIPTION OF THE EXEMPLARY EMBODIMENTS

Figure 1:
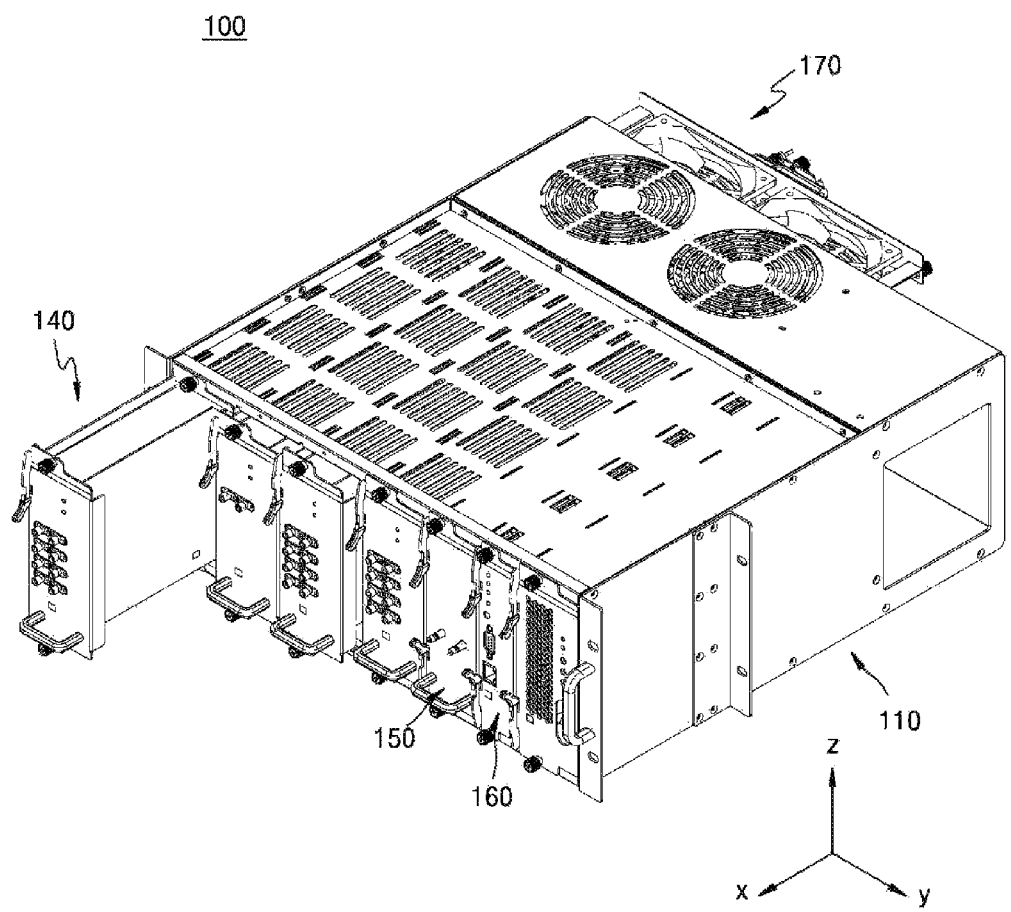
FIG. 1 is a perspective view from the front of a base station interface device, according to an embodiment of the inventive concept.

Reference will now be made in detail to embodiments, examples of which are illustrated in the accompanying drawings, wherein like reference numerals refer to like elements throughout. Like reference numerals refer to like elements throughout the drawings. It will be understood that, although the terms first, second, etc. may be used herein to describe various elements, these elements should not be limited by these terms. These terms are only used to distinguish one element from another. In the description of the present disclosure, certain detailed explanations of the related art are omitted when it is deemed that they may unnecessarily obscure the essence of the inventive concept. As used herein, the term "and/or" includes any and all combinations of one or more of the associated listed items. Expressions such as "at least one of," when preceding a list of elements, modify the entire list of elements and do not modify the individual elements of the list.

Figure 2:
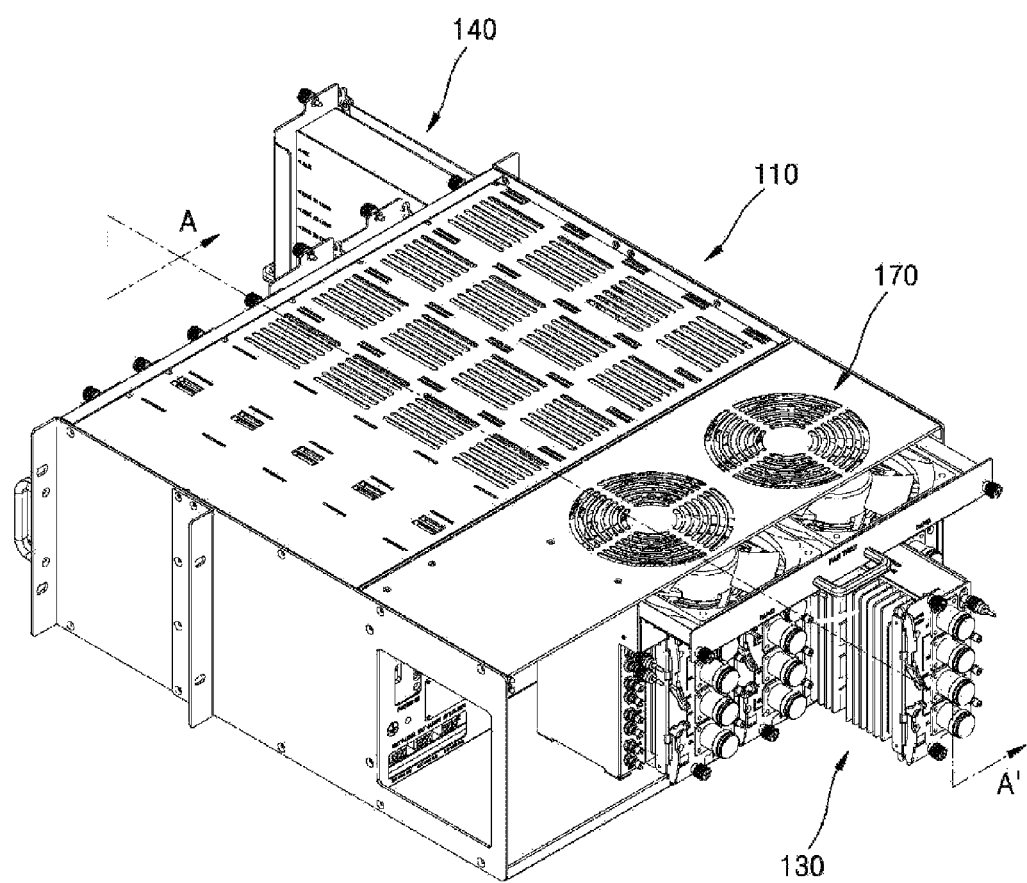
FIG. 2 is a perspective view from the back of the base station interface device of FIG. 1.
Figure 3:
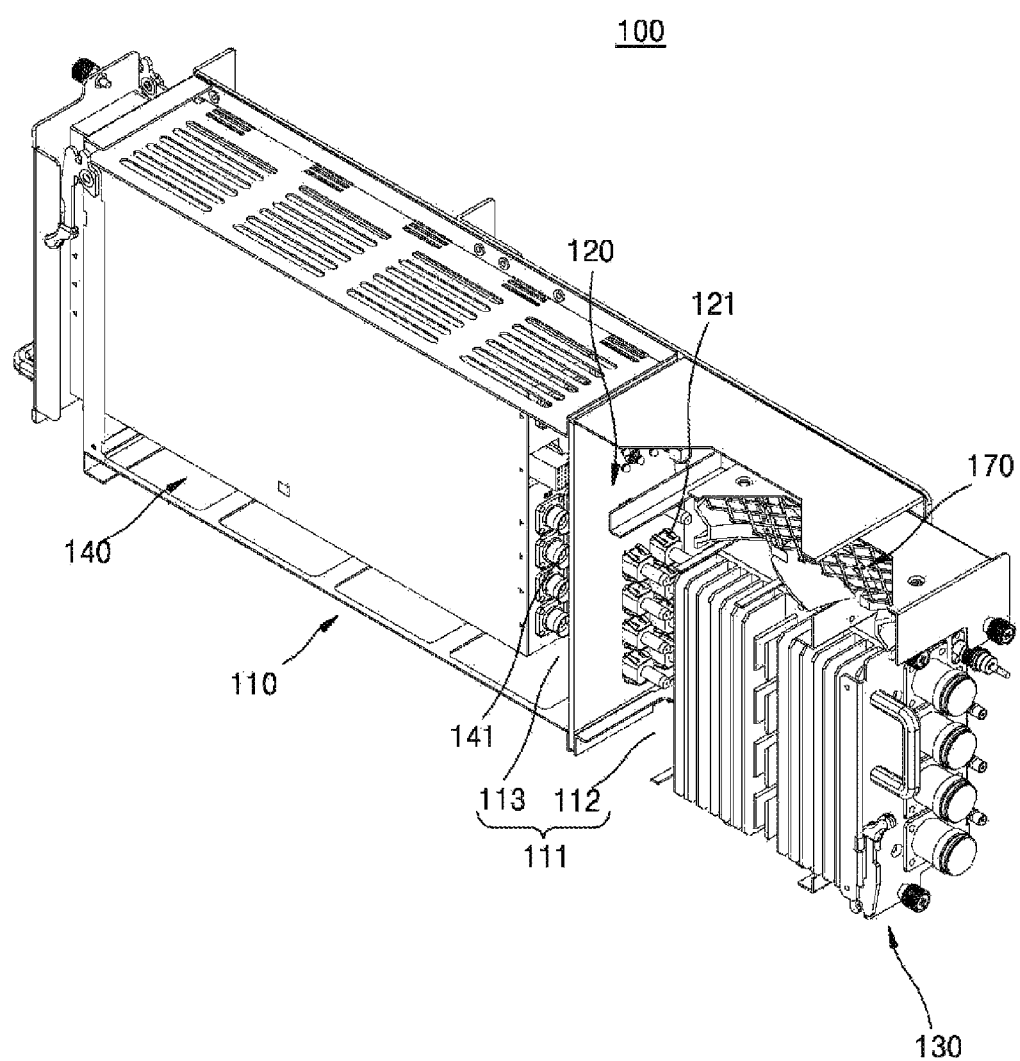
FIG. 3 is a perspective view of a main structure taken along lines A-A' of the base station interface device of FIG. 2.
Figure 4:
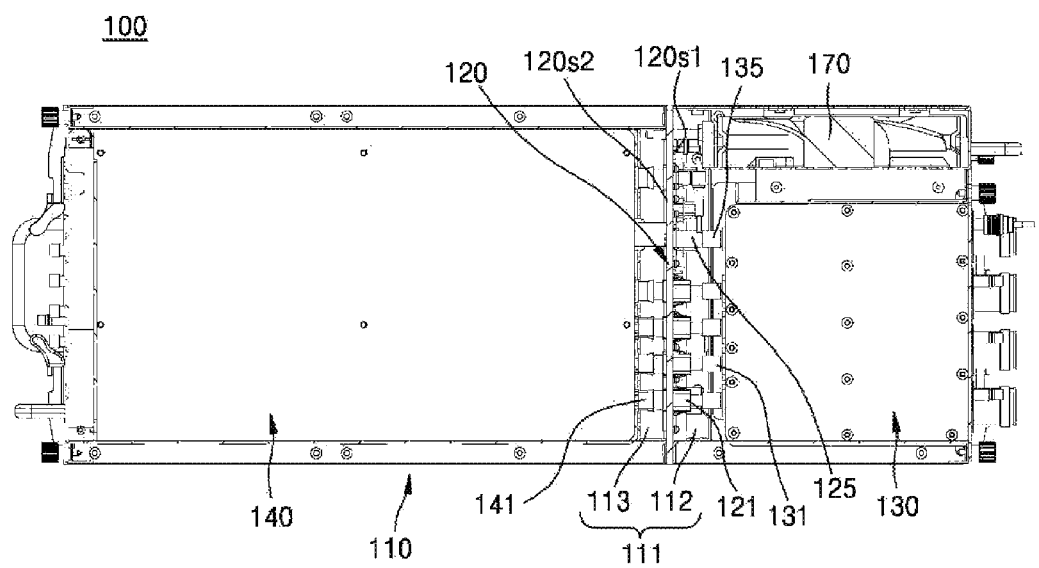
FIG. 4 is a cross-sectional view of a main structure of the base station interface device of FIG. 3.

FIG. 1 is a perspective view from the front of a base station interface device 100, according to an embodiment of the inventive concept, FIG. 2 is a perspective view from the back of the base station interface device 100 of FIG. 1, FIG. 3 is a perspective view of a main structure taken along lines A-A' of the base station interface device 100 of FIG. 2, and FIG. 4 is a cross-sectional view of a main structure of the base station interface device 100 of FIG. 3. FIGS. 1 to 3 show any one of a plurality of base station signal matching units 130 and any one of a plurality of base station signal processing units 140 that are separated from each other, but it is only for convenience of explanation, and therefore, each of the separated base station signal matching unit and the base station signal processing unit may be coupled with a corresponding unit for operation as illustrated in FIG. 4. Hereinafter, the base station interface device 100 will be described with reference to FIGS. 1 to 4.

Referring to FIGS. 1 through 4, the base station interface device 100 may include a housing 110, an interface board 120, at least one base station signal matching unit 130, at least one base station signal processing unit 140, a combination distribution unit 150, a control unit 160, and a fan unit 170.

The housing 110 may accommodate the interface board 120, the base station signal matching unit 130, and the base station signal processing unit 140 inside and may protect them from outside.

The housing 110 may have a structure with both sides opened based on an x-direction, and slot-type mounting locations may be determined by a plurality of housing spaces partitioned by inner sidewalls and/or guide members, the slot-type mounting locations on which the base station signal matching unit 130 and the base station signal processing unit 140 are mounted by the interface board 120.

For example, a first housing space 111 may include a first mounting location 112 in which one of the base station signal matching units 130 is mounted on a first surface $120s1$ of the interface board 120 by the interface board 120, and a second mounting location 113 in which the base station signal processing unit 140 corresponding to the base station signal matching unit 130 is mounted on a second surface $120s2$ facing the first surface $120s1$. The base station signal matching unit 130 may be slidably mounted on the first mounting location 112 through one open side, and the base station signal processing unit 140 may be slidably mounted on the second mounting location 113 through the open side. Accordingly, the base station signal matching unit 130 and the base station signal processing unit 140 corresponding to each other may be arranged in the same plane and in a row along the x-direction.

As another example, a second housing space may include a third mounting location in which the fan unit 170 is mounted on the first surface $120s1$ of the interface board 120 by the interface board 120. The third mounting location may be higher than the first mounting location 112 on which the base station signal matching unit 130 is mounted based on a z-direction. Therefore, the fan unit 170 may be disposed on an upper portion of the base station signal matching unit 130.

As another example, a third housing space may include fourth and fifth mounting locations in which the combination distribution unit 150 and the control unit 160 are mounted on the second surface 120s2 of the interface board 120 by the interface board 120. The fourth and fifth mounting locations may continuously follow the second mounting location 113 on which the base station signal processing unit 140 are mounted based on a y-direction.

FIGS. 1 through 4 illustratively show mounting locations and mounting states of the base station signal matching unit 130, the base station signal processing unit 140, the combination distribution unit 150, the control unit 160, and the fan unit 170, but a mounting location and a mounting state of each of the units may vary.

The interface board 120 may be disposed in a direction crossing the x-direction in the housing 110, for example, the y-direction, and may perform an interface function for signal transmission between components by being electrically connected to various components such as the base station signal matching unit 130 and the base station signal processing unit 140 via a connector or a cable.

For example, the interface board 120, which is connected to the base station signal matching unit 130 and the base station signal processing unit 140 corresponding to each other through a relay connector 121, may transmit a base station signal (downlink signal) passed through the base station signal matching unit 130 to the base station signal processing unit 140, or may transmit a terminal signal (uplink signal) passed through the base station signal processing unit 140 to the base station signal matching unit 130.

The relay connector 121 may be coupled to a main body of the interface board 120 penetrating through the main body of the interface board 120, and thus, one end of the relay connector 121 may be exposed to the first mounting location 112 toward the base station signal matching unit 130, and the other end of the relay connector 121 may be exposed to the second mounting location 113 toward the base station signal processing unit 140. The relay connector 121 may be coupled to each of a first connector 131 of the base station signal matching unit 130 and a second connector 141 of the base station signal processing unit 140, and may further include a tapered portion or an elastic member to compensate a misalignment during coupling. A specific structure of the relay connector 121 will be described in detail later below referring to FIG. 5.

The base station signal matching unit 130 may match signals transmitted and received between at least one base station and a distributed antenna system (DAS) including the base station interface device 100. When the base station interface device 100 is connected to a plurality of base stations, the base station signal matching unit 130 may be provided in the base station interface device 100 corresponding to each of the base stations. However, the inventive concept is not limited thereto.

In an example of a downlink path in which base station signals received from a base station are transmitted to a user terminal through a DAS, the base station signal matching unit 130 may reduce a power level of a base station signal having high power such that the base station signal is processed by the base station signal processing unit 140 and/or another node devices (for example, a remote device, an extension device, etc.) of the DAS.

Meanwhile, the base station signal matching unit 130, to be electrically connected to the corresponding base station signal processing unit 140 through the interface board 120, may include the first connector 131 corresponding to the relay connector 121 provided in the interface board 120. The first connector 131 may include a tapered portion capable of compensating a misalignment due to an error in location or magnitude when the first connector 131 is coupled to the corresponding relay connector 121. The first connector 131 will be described in detail later below referring to FIG. 6.

The base station signal processing unit 140 may perform a predetermined signal process on a base station signal output from the corresponding base station signal matching unit 130, or may perform a predetermined signal process on a terminal signal transmitted from another node device of a DAS. When the base station interface device 100 is connected to a plurality of base stations, the base station signal process unit 140 may be provided in the base station interface device 100 corresponding to each of the base stations. However, the inventive concept is not limited thereto.

In an example of a downlink path, the base station signal processing unit 140 may perform various signal processes such as low-noise amplification, filtering, gain control, or amplification on a base station signal output from the base station signal matching unit 130 to meet a service condition of a preset frequency band.

The base station signal processing unit 140 may include the second connector 141 corresponding to the relay connector 121 to be electrically connected to the corresponding base station signal matching unit 130 through the interface board 120. The second connector 141 may include a tapered portion capable of compensating a misalignment due to an error in location or magnitude when the first connector 131 is coupled to the corresponding relay connector 121. The second connector 141 will be described in detail later below referring to FIG. 7.

As such, in the base station interface device 100, the base station signal matching unit 130 and the base station signal processing unit 140 corresponding to each other may be arranged in the same plane as a monolayer. Furthermore, even if errors occur in locations of units or connecting members when the base station signal matching unit 130 and the base station signal processing unit 140 are connected to each other on both surfaces of the interface board 120 through the relay connector 121 without a cable, the base station signal matching unit 130 and the base station signal processing unit 140 may be stably connected to each other because a tapered portion compensating the errors is formed in at least one of the relay connector 121 and connectors corresponding to the relay connector 121.

Therefore, the base station interface device 100 may efficiently use the limited space in a housing, may be miniaturized, may improve convenience for a manager, and may stably maintain a connection state between the base station signal matching unit 130 and the base station signal process unit 140.

The combination distribution unit 150 may couple base station signals output from a plurality of base station signal processing units 140 and may transmit the coupled base station signals to at least one light distribution unit (not shown). The light distribution unit may convert the coupled base station signals to light signals and may transmit the light signals to a plurality of remote devices (not shown) formed in a remote place. The remote devices may photo-electrically convert the transmitted light signals and may perform a signal process such as filtering or amplification on the converted base station signals per frequency band or per at least two frequency bands, and may transmit the base station signals to a user terminal by radiating the base station signals through an antenna.

The control unit 160 may control components included in the base station interface device 100 such as the base station signal matching unit 130 or the base station signal processing unit 140, and may monitor a state of each of the components.

Not shown in FIGS. 1 and 2, the control unit 160 may be electrically connected to a plurality of base station signal matching units 130 or a plurality of base station signal processing units 140 through the interface board 120, and may transmit and receive predetermined signals (for example, control signals, state signals, etc.) to/from the plurality of base station signal matching units 130 or the plurality of base station signal processing units 140 through the interface board 120.

The fan unit 170 may remove heat from the base station signal matching unit 130 and may include a plurality of fans. The plurality of fan may be formed to cool at least two base station signal matching units 130, but may also be formed to cool the plurality of base station signal matching units 130, respectively.

The control unit 160 may control the drive of the fan unit 170. This will be described in detail later below.

First, in the base station interface device 100 according to an embodiment of the inventive concept, the interface board 120 may include a first sensing connector 125, and the base station signal matching unit 130 may include a second sensing connector 135. The first sensing connector 125, which is disposed adjacent to the relay connector 121, may be exposed to an upper side of the first surface 120s1 of the interface board 120 toward the first mounting location 112, and the second sensing connector 135, which is disposed adjacent to the first connector 131, may be configured the first sensing connector 125 to form a ground state when the second sensing connector 135 is coupled to the first sensing connector 125.

The control unit 160 may sense whether the first sensing connector 125 grounds the second sensing connector 135 according to whether the first sensing connector 125 is coupled to the second sensing connector 135. Therefore, the control unit 160 may sense whether the base station signal matching unit 130 is connected to the interface board 120, and may control an operation of the fan unit 170 according to the sensing result.

In more detail, when the control unit 160 senses that the first sensing connector 125 is coupled to the second sensing connector 135 and is grounded, the control unit 160 may remove heat from the base station signal matching device 130 including the second sensing connector 135 by driving the fan unit 170 in a manner where a fan on the base station signal matching device 130 including the second sensing connector 135 is operated.

In the base station interface device 100, the control unit 160 may control the drive of the fan unit 170 according to a state of the base station signal matching unit 130, in more detail, according to whether the base station signal matching unit 130 is properly connected to the interface board 120 and operated. Therefore, equipment damage or malfunction may be prevented by performing a stable heat dissipation function while minimizing waste of power consumption.

Structures of the first and second sensing connectors 125 and 135 will be described in detail later below referring to FIGS. 8 and 9.

Figure 5:
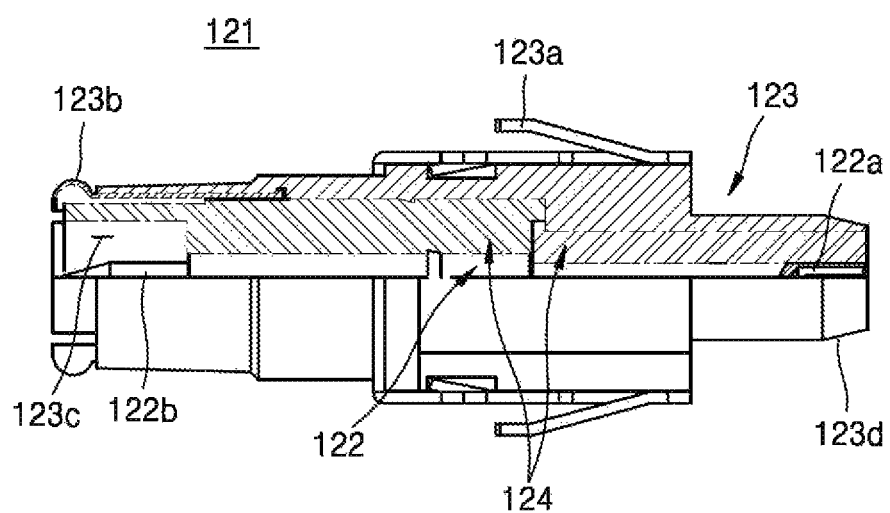
FIG. 5 is a partial cross-sectional view of a relay connector according to an embodiment of the inventive concept.
Figure 6:
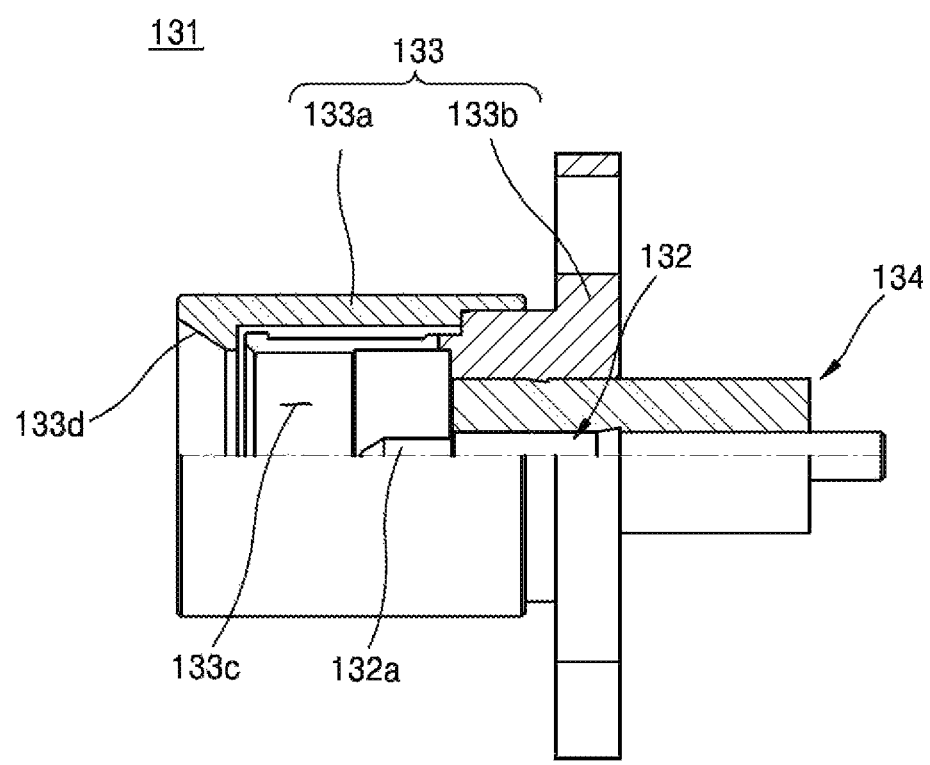
FIG. 6 is a partial cross-sectional view of a first connector according to an embodiment of the inventive concept.
Figure 7:
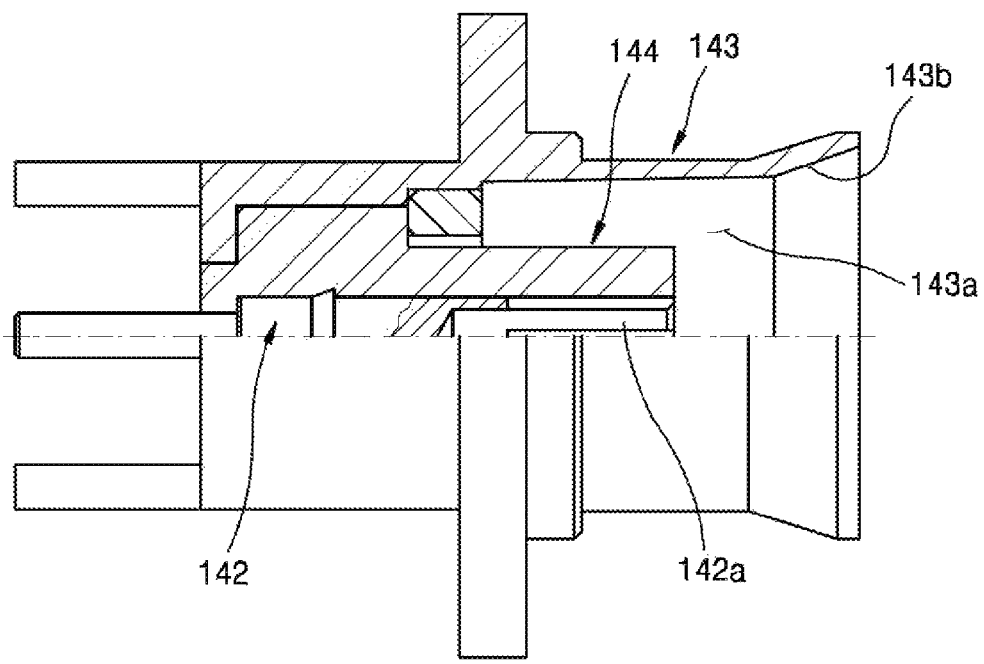
FIG. 7 is a partial cross-sectional view of a second connector according to an embodiment of the inventive concept.

FIG. 5 is a partial cross-sectional view of a relay connector according to an embodiment of the inventive concept, FIG. 6 is a partial cross-sectional view of a first connector according to an embodiment of the inventive concept, and FIG. 7 is a partial cross-sectional view of a second connector according to an embodiment of the inventive concept. The relay connector, the first connector, and the second connector of FIGS. 5 to 7 correspond to the relay connector 121, the first connector 131, and the second connector 141 described with reference to FIGS. 1 through 4, respectively. Hereinafter, repeated descriptions of FIGS. 1 to 4 are omitted and only specific constitutions and coupling relationships of the relay connector 121, and the first and second connectors 131 and 141 are described.

Referring to FIG. 5, the relay connector 121, which is provided in the interface board 120 and the both ends are respectively coupled to corresponding connectors of the first and second connectors 131 and 141, may electrically connect the base station signal matching unit 130 and the base station signal processing unit 140.

The relay connector 121 may include a relay connector contact 122, a relay connector body 123, and a relay connector insulating member 124.

The relay connector contact 122 may extend to penetrate through a main body of the interface board 120, wherein one end of the relay connector contact 122 may contact a first connector contact 132 of the first connector 131, and the other end of the relay connector contact 122 may contact a second connector contact 142 of the second connector 141. Therefore, a signal (for example, a base station signal having an adjusted power level) flowing the first connector contact 132 may be transmitted to the second connector contact 142 through the relay connector contact 122, and the base station signal having an adjusted power level may be processed according to a service condition of a frequency band set in advance in the base station signal processing unit 140.

One side of the relay connector contact 122 may include a groove 122a and the other side may include a projecting fin 122b. The relay connector contact 122 and the first connector contact 132 may be physically and electrically connected to each other as a projecting fin 132a (described later below) of the first connector contact 132 is inserted in the one side of the relay connector contact 122, that is, the groove 122a. Furthermore, the relay connector contact 122 and the second connector contact 142 may be physically and electrically connected to each other as the other side of the relay connector contact 122, that is, the projecting fin 122b is inserted in a groove 142a (described later below) of the second connector contact 142. The relay connector contact 122 may include a conductive material such as a metal material, for example, gold.

The relay connector body 123 may protect the relay connector contact 122 from outside and may surround the relay connector contact 122. The relay connector body 123, to stably protect the relay connector contact 122, may include a conductive material having a predetermined strength such as a metal material, for example, nickel.

The relay connector insulating member 124 may be located between the relay connector contact 122 and at least a part of the relay connector body 123 and may prevent a short-circuit between the relay connector contact 122 and the relay connector body 123. The relay connector insulating member 124 may include an insulating material, for example, polytetrafluoroethylene (PTFE).

The relay connector insulating member 124 may include two parts that are distinguished by shape and/or composition, for example, a part toward the first connector 131 and a part toward the second connector 141. Furthermore, the relay connector insulating member 124 may contact some part of an outer peripheral surface of the relay connector contact 122 but may be spaced apart from the other part and between which an empty space 123c is interposed. When the relay connector insulating member 124 is combined with the second connector 141, some of the second connector contact 142 and a second connector insulating member 144 of the second connector 141 may be inserted in the empty space 123c.

According to an embodiment, the relay connector body 123 may further include a clip unit 123a and an elastic member 123b. The clip unit 123a may couple the relay connector 121 penetrating through a main body of the interface board 120 to the main body of the interface board 120 and may support the relay connector 121. The elastic member 123b, disposed on a tip toward the second connector 141, may maintain the coupling state by compensating an alignment error which occurs when the relay connector 121 is coupled to the second connector 141. In more detail, the elastic member 123b may compensate a misalignment because the elastic member 123b can be elastically deformed in a coupling direction of the relay connector 121 and the second connector 141, and may firmly maintain the coupling state of the relay connector 121 and the second connector 141 by being restored and applying an elastic force to the second connector 141 when the relay connector 121 is coupled to the second connector 141.

In some embodiments, the elastic member 123b may include a plurality of opened pieces arranged in a circle on an outer peripheral surface of a tip of the relay connector body 123. Furthermore, at least some of the plurality of opened pieces may become narrower inward when the relay connector 121 is inserted in the second connector 141, and the narrowed opened pieces may become wider outward after the relay connector 121 is inserted in the second connector 141 and the elastic member 123b may be restored to an original location. However, the inventive concept is not limited thereto. The elastic member 123b may be formed in various structures.

According to an embodiment, the relay connector body 123 may include a complementary tapered portion 123d, in which a diameter of the complementary tapered portion 123d becomes smaller toward the first connector 131. The complementary tapered portion 123d may have a slope in a direction opposite to a tapered portion 133d of the first connector 131, and may compensate a misalignment between the relay connector body 123 and the first connector body 133 when the relay connector body 123 is inserted in the first connector body 133 of the first connector 131.

Referring to FIG. 6, the first connector 131 provided in the base station signal matching unit 130 may transmit a base station signal to the relay connector 121, in which the base station signal has a lowered power level by being coupled to the relay connector 121.

The first connector 131 may include the first connector contact 132, the first connector body 133, and a first connector insulating member 134.

The first connector contact 132 may contact the relay connector contact 122. In detail, the first connector contact 132 may physically and electrically contact the relay connector contact 122 by a method of inserting the projecting fin 132a of the first connector contact 132 to the groove 122a formed in the one side of the relay connector contact 122. The first connector contact 132 may include a conductive material such as a metal material, for example, gold.

The first connector body 133 may protect the first connector contact 132 from outside and may surround the first connector contact 132. The first connector body 133 may include a conductive material having a predetermined strength to stably protect the first connector contact 132.

The first connector insulating member 134 may be located between the first connector contact 132 and at least a part of the first connector body 133 and may prevent a short-circuit between the first connector contact 132 and the first connector body 133. The first connector insulating member 134 may include an insulating material.

According to an embodiment, the first connector body 133 may include a first cap 133a and a first support unit 133b supporting the first cap 133a. The first cap 133a may be located adjacent to the relay connector 121, and the first support unit 133b may be located in a region far from the relay connector 121, for example, the base station signal matching unit 130.

The first connector insulating member 134 may be located between the first support unit 133b and the first connector contact 132, and for example, an empty space 133c but not the first connector insulating member 134 may be formed between the first cap 133a and the first connector contact 132. When the first connector 131 is coupled to the relay connector 121, some of the relay connector body 123, the relay connector insulating member 124, and the relay connector contact 122 may be inserted in the empty space 133c.

In order to smoothly couple the first connector 131 to the relay connector 121, the first cap 133a of the first connector body 133 may include the tapered portion 133d, in which a diameter of the tapered portion 133d becomes larger toward the relay connector 121. Therefore, when the relay connector 121 is inserted in and coupled to the first connector 131, an alignment error may be compensated by the tapered portion 133d even if the relay connector 121 and the first connector 131 are not accurately aligned.

Referring to FIG. 7, the second connector 141 provided in the base station signal processing unit 140 may receive a base station signal from the relay connector 121 by being coupled to the relay connector 121.

The second connector 141 may include the second connector contact 142, a second connector body 143, and the second connector insulating member 144.

The second connector contact 142 may contact the relay connector contact 122. In detail, the second connector contact 142 may physically and electrically contact the relay connector contact 122 by a method of inserting the projecting fin 122b formed on the other side of the relay connector contact 122 to the groove 142a of the second connector contact 142. The second connector contact 142 may include a conductive material such as a metal material, for example, gold.

The second connector body 143 may protect the second connector contact 142 from outside and may surround the second connector contact 142. The second connector body 143 may include a conductive material having a predetermined strength to stably protect the second connector contact 142.

The second connector insulating member 144 may be located between the second connector contact 142 and at least a part of the second connector body 143 and may prevent a short-circuit between the second connector contact 142 and the second connector body 143. The second connector insulating member 144 may include an insulating material.

According to an exemplary embodiment, an empty space 143a may be formed in at least some areas between the second connector body 143 and the second connector insulating member 144. The empty space 143a may be adjacent to the relay connector 121 and some of the relay connector body 123 and the relay connector insulating member 124 may be inserted in the empty space 143*a* when the second connector 141 is coupled to the relay connector 121.

In order to smoothly couple the second connector 141 to the relay connector 121, the second connector body 143 may include a tapered portion 143*b*, in which a diameter of the tapered portion 143*b* becomes larger toward the relay connector 121. Therefore, when the relay connector 121 is inserted in and coupled to the second connector 141, an alignment error may be compensated by the tapered portion 143*d* even if locations of the relay connector 121 and the second connector 141 are not accurately matched to each other.

Figure 8:
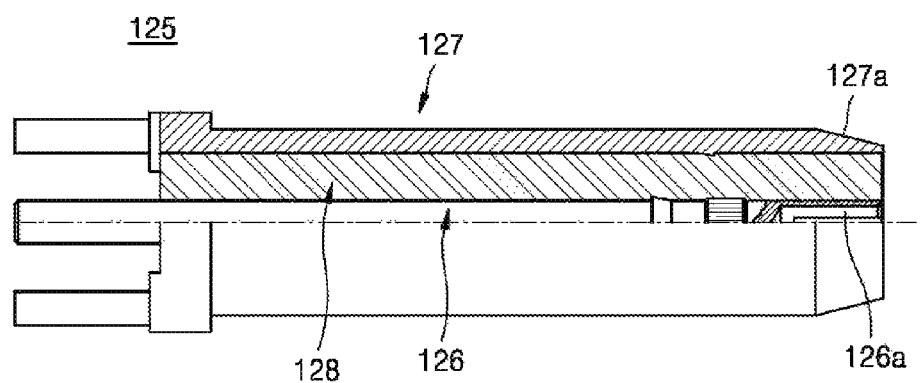
FIG. 8 is a partial cross-sectional view of a first sensing connector according to an embodiment of the inventive concept.
Figure 9:
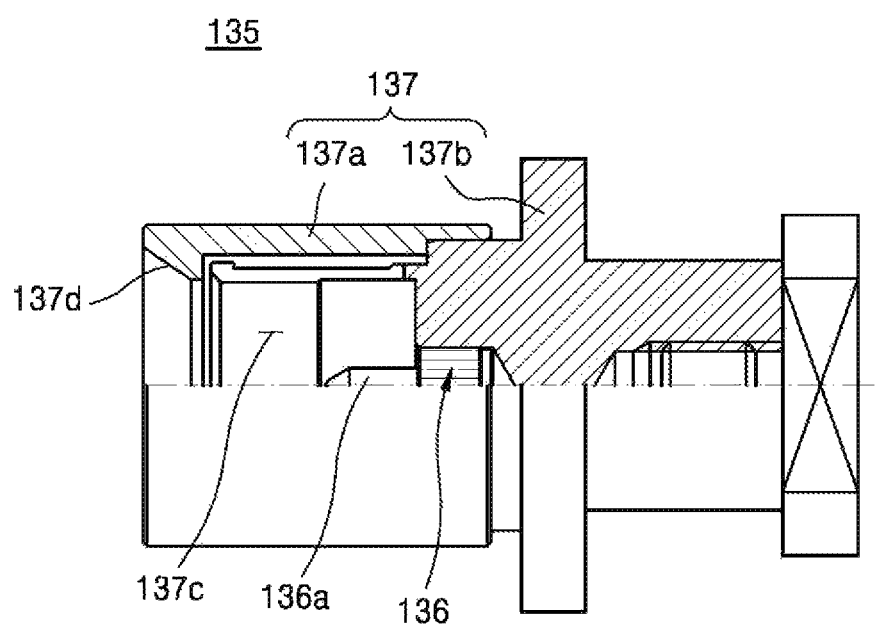
FIG. 9 is a partial cross-sectional view of a second sensing connector according to an embodiment of the inventive concept.

FIG. 8 is a partial cross-sectional view of a first sensing connector according to an embodiment of the inventive concept, and FIG. 9 is a partial cross-sectional view of a second sensing connector according to an embodiment of the inventive concept. The first and second sensing connectors of FIGS. 8 and 9 correspond to the first and second sensing connectors 125 and 135 described with reference to FIGS. 1 through 4, respectively. Hereinafter, repeated descriptions of FIGS. 1 to 4 are omitted and only specific constitutions and coupling relationships of the first and second sensing connectors 125 and 135 are described.

Referring to FIG. 8, the first sensing connector 125, which is provided in the interface board 120 and coupled to the second sensing connector 135, may sense mounting of the base station signal matching unit 130, that is, a connection state of the base station signal matching unit 130 and the interface board 120 by the control unit 160 (see FIG. 1).

The first sensing connector 125 may include a first sensing connector contact 126, a first sensing connector body 127, and a first sensing connector insulating member.

The first sensing connector contact 126 may contact a second sensing connector contact 136 of the second sensing connector 135. The first sensing connector contact 126, which includes a groove 126*a*, may be physically and electrically connected to the second sensing connector contact 136 by a method of inserting a projecting fin 136*a* of the second sensing connector contact 136 to the groove 126*a*. The first sensing connector contact 126 may include a conductive material.

The first sensing connector body 127 may protect the first sensing connector contact 126 from outside and may surround the first sensing connector contact 126. The first sensing connector body 127 may include a conductive material having a predetermined strength to stably protect the first sensing connector contact 126.

The first sensing connector insulating member 128 may be located between the first sensing connector contact 126 and at least a part of the first sensing connector body 127 and may prevent a short-circuit between the first sensing connector contact 126 and the first sensing connector body 127. The first sensing connector insulating member 128 may include an insulating material.

According to an embodiment, the first sensing connector body 127 may include a complementary tapered portion 127*a*, in which a diameter of the complementary tapered portion 127*a* becomes smaller toward the second sensing connector 135. The complementary tapered portion 127*a* may have a slope in a direction opposite to a tapered portion 137*d* of the second sensing connector 135, and may compensate a misalignment between the first sensing connector body 127 and a second sensing connector body 137 when the first sensing connector body 127 is inserted in the second sensing connector body 137 of the second sensing connector 135.

Referring to FIG. 9, the second sensing connector 135, which is provided in the base station signal matching unit 130 and coupled to the first sensing connector 125, may sense a connection state of the base station signal matching unit 130 and the interface board 120 by the control unit 160 (see FIG. 1).

The second sensing connector 135 may include the second sensing connector contact 136 and the second sensing connector body 137. The second sensing connector contact 136 may be physically and electrically connected to the first sensing connector contact 126 through coupling of a groove and a projecting fin, and may include a conductive material.

The second sensing connector body 137 may protect the second sensing connector contact 136 from outside and may surround the second sensing connector contact 136. The second sensing connector body 137 may include a conductive material having a predetermined strength to stably protect the second sensing connector contact 136.

Meanwhile, the second sensing connector body 137 may directly contact at least a part of the second sensing connector contact 136 unlike the first connector 131 of the base station signal matching unit 130 (or unlike the second connector 141 of the base station signal processing unit 140).

Therefore, the second sensing connector body 137 that is a ground and the second sensing connector contact 136 are short circuited, and thus, both the second sensing connector body 137 and the second sensing connector contact 136 may function as a ground, and the control unit 160 (see FIG. 1) may sense a connection state of the base station signal matching unit 130 and the interface board 120 by sensing a current or a voltage according to a ground state which is formed when the second sensing connector 135 is coupled to the first sensing connector 125. As described above with reference to FIGS. 1 through 4, the control unit 160 may control the fan unit 170 based on the sensing result of the connection state of the base station signal matching unit 130 and the interface board 120.

According to an exemplary embodiment, the second sensing connector body 137 may include a second cap 137*a* and a second support unit 137*b* supporting the second cap 137*a*. The second cap 137*a* may be located adjacent to the first sensing connector 125, and the second support unit 137*b* may be located in a region far from the first sensing connector 125, for example, the base station signal matching unit 130.

The second support unit 137*b* may contact the second sensing connector contact 136, and the second cap 137*a* and the second sensing connector contact 136 may be spaced apart from each other without contacting each other and between which an empty space 137*c* is interposed. When the first sensing connector 125 is coupled to the second sensing connector 135, some of the first sensing connector body 127, the first sensing connector insulating member 128, and the first sensing connector contact 126 may be inserted in the empty space 137*c*.

In order to smoothly couple the first sensing connector 125 to the second sensing connector 135, the second cap 137*a* of the second sensing connector body 137 may include the tapered portion 137*d*, in which a diameter of the tapered portion 137*d* becomes larger toward the first sensing connector 125. Therefore, when the first sensing connector 125 is inserted in and coupled to the second sensing connector 135, the first sensing connector 125 may be accurately coupled to the second sensing connector 135 by the tapered portion 137d even if locations of the first sensing connector 125 and the second sensing connector 135 are not accurately matched to each other.

According to an embodiment of the inventive concept, a base station interface device may efficiently use a limited space by arranging a base station signal matching unit and a base station signal processing unit in the same plane and in a row.

Furthermore, according to an embodiment of the inventive concept, a base station interface device, by electrically connecting a base station signal matching unit and a base station signal processing unit by using connectors without a cable, may improve convenience of management for a manager and may stably protect the connection between the units from outside.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A base station interface device comprising:
    an interface board, which is located in a housing and has a first surface and a second surface opposite to the first surface, comprising a relay connector of which one end is exposed on the first surface and an opposite end is exposed on the second surface;
    a base station signal matching unit mounted on the first surface and comprising a first connector coupled to the one end of the relay connector; and
    a base station signal processing unit mounted on the second surface and comprising a second connector coupled to the opposite end of the relay connector,
    wherein at least one of the first and second connector comprises a tapered portion, wherein a diameter of the tapered portion becomes larger toward one of the one end or the opposite end of the relay connector, and
    wherein, when the one end of the relay connector is coupled to the first connector and the opposite end of the relay connector is coupled to the second connector, at least one base station signal is transmitted from the base station signal matching unit to the base station signal processing unit through the relay connector.

2. The base station interface device of claim 1, wherein the relay connector comprises:
    a relay connector contact wherein one end contacts a first connector contact of the first connector and the opposite end contacts a second connector contact of the second connector;
    a relay connector body configured to surround the relay connector contact; and
    a relay connector insulating member located between the relay connector contact and at least a part of the relay connector body.

3. The base station interface device of claim 2, wherein the first connector comprises the tapered portion, wherein a diameter of the tapered portion becomes larger toward the relay connector, and
    wherein the relay connector body comprises a complementary tapered portion, wherein a diameter of the complementary tapered portion becomes smaller toward the first connector.

4. The base station interface device of claim 2, wherein the second connector comprises the tapered portion, wherein a diameter of the tapered portion becomes larger toward the relay connector, and
    wherein the relay connector body comprises an elastic member which is disposed on a tip toward the second connector and capable of being elastically deformed in a direction crossing a coupling direction of the second connector and the relay connector when the second connector is coupled to the relay connector.

5. The base station interface device of claim 1, wherein the relay connector penetrates through a main body of the interface board, wherein the one end is exposed on the first surface and the opposite end is exposed on the second surface.

6. The base station interface device of claim 1, wherein at least a part of the relay connector is inserted in and coupled to the first connector.

7. The base station interface device of claim 1, wherein at least a part of the relay connector is inserted in and coupled to the second connector.

8. The base station interface device of claim 1, wherein the first connector comprises:
    a first connector contact configured to contact a relay connector contact of the relay connector;
    a first connector body configured to surround the first connector contact; and
    a first connector insulating member located between the first connector contact and at least a part of the first connector body.

9. The base station interface device of claim 8, wherein the first connector body comprises:
    a first cap comprising the tapered portion, wherein a diameter of the tapered portion becomes larger toward the relay connector; and
    a first support unit configured to support the first cap.

10. The base station interface device of claim 1, wherein the second connector comprises:
    a second connector contact configured to contact a relay connector contact of the relay connector;
    a second connector body configured to surround the second connector contact and form the tapered portion, wherein a diameter of the tapered portion becomes larger toward the relay connector; and
    a second connector insulating member located between the second connector contact and at least a part of the second connector body.

11. The base station interface device of claim 1, wherein the interface board comprises a first sensing connector distinct from the relay connector, wherein one end of the first sensing connector is exposed on the first surface
    wherein the base station signal matching unit comprises a second sensing connector to be coupled to the first sensing connector, and
    wherein the first sensing connector and the second sensing connector are connectors for sensing an electrical connection between the interface board and the base station signal matching unit.

12. The base station interface device of claim 11, wherein at least a part of the first sensing connector is inserted in and coupled to the second sensing connector.

13. The base station interface device of claim 11, wherein the second sensing connector comprises a sensing connector tapered portion, wherein a diameter of the sensing connector tapered portion becomes larger toward the first sensing connector.

14. The base station interface device of claim 11, wherein the second sensing connector comprises:
   a second sensing connector contact configured to contact a first sensing connector contact of the first sensing connector; and
   a second sensing connector body configured to surround the second sensing connector contact, wherein
   the second sensing connector contact and at least a part of the second sensing connector body directly contact each other.

15. A base station interface device comprising:
   an interface board, which is located in a housing and has a first surface and a second surface opposite to the first surface, comprising:
      a relay connector of which one end is exposed on the first surface and an opposite end is exposed on the second surface; and
      a first sensing connector of which one end is exposed on the first surface;
   a base station signal matching unit mounted on the first surface and comprising a first connector coupled to the one end of the relay connector and a second sensing connector to be coupled to the first sensing connector;
   a base station signal processing unit mounted on the second surface and comprising a second connector coupled to the opposite end of the relay connector; and
   a control unit configured to sense an electrical connection between the interface board and the base station signal matching unit through a coupling of the first sensing connector and the second sensing connector,
   wherein at least one of the first and second connector comprises a tapered portion, wherein a diameter of the tapered portion becomes larger toward one of the one end or the opposite end of the relay connector.

16. The base station interface device of claim 15, further comprising:
   a fan unit, which is disposed adjacent to the base station signal matching unit, configured to remove heat from the base station signal matching unit, and
   wherein the control unit drives the fan unit when the electrical connection between the interface board and the base station signal matching unit is sensed.

* * * * *